(12) United States Patent
Chen et al.

(10) Patent No.: US 6,358,827 B1
(45) Date of Patent: Mar. 19, 2002

(54) METHOD OF FORMING A SQUARED-OFF, VERTICALLY ORIENTED POLYSILICON SPACER GATE

(75) Inventors: Han-Ping Chen; Hung-Chen Sung; Cheng-Yuan Hsu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/764,232

(22) Filed: Jan. 19, 2001

(51) Int. Cl.⁷ .................. H01L 21/336; H01L 21/3205; H01L 21/4763
(52) U.S. Cl. .................. 438/585; 438/264; 438/301; 438/304; 438/596
(58) Field of Search .................. 438/217, 289, 438/301, 304, 305, 585, 596, 257, 264

(56) References Cited

U.S. PATENT DOCUMENTS

| | | | |
|---|---|---|---|
| 5,404,038 A | 4/1995 | Morihara | 257/329 |
| 5,479,368 A | 12/1995 | Keshtbod | 365/185.01 |
| 5,672,532 A | * 9/1997 | Hsue et al. | 437/48 |
| 5,981,346 A | * 11/1999 | Hopper | 438/304 |
| 6,008,087 A | * 12/1999 | Wu | 438/257 |
| 6,010,934 A | 1/2000 | Wu | 438/264 |
| 6,063,668 A | 5/2000 | He et al. | 438/264 |
| 6,074,914 A | 6/2000 | Ogura | 438/257 |
| 6,107,127 A | * 8/2000 | Kocon | 438/217 |
| 6,124,174 A | * 9/2000 | Gardner et al. | 438/303 |
| 6,225,201 B1 | * 5/2001 | Gardner et al. | 438/585 |

* cited by examiner

Primary Examiner—John F. Niebling
Assistant Examiner—Walter L. Lindsay, Jr.

(74) Attorney, Agent, or Firm—George O. Saile; Stephen B. Ackerman

(57) ABSTRACT

A method is taught for forming a rectangular or near rectangular polysilicon sidewall structure, which can be used as an ultra narrow MOSFET gate electrode. The method employs the use a step on a sacrificial oxide against which the polysilicon sidewall is formed. An etch stop, such as a gate oxide is formed alongside the step. A polysilicon layer is deposited over the step followed by a silicon nitride layer. Next a flowable layer is deposited and cured. In a first embodiment the flowable layer is deposited to completely cover the polysilicon layer. Next the wafer is planarized to exposed the polysilicon layer over the high part of the step an to a level wherein the polysilicon/silicon nitride interface is driven away from the step to a distance which determines the final width of the final sidewall structure. The residual flowable layer is then removed and a silicon oxide hardmask is grown over the exposed polysilicon. The polysilicon is anisotropically etched, part way to the through and the hardmask is removed. Anisotropic etching is then continued until the etch stop and the top of the sacrificial oxide are exposed, leaving a polysilicon sidewall with a rectangular cross section. In a second embodiment, the flowable layer is deposited to partially fill the valley next to the step. The second embodiment, which is less complex than the first and does not employ planarization processing, forms a near rectangular sidewall structure with a curved top surface. This profile is useable in most sidewall polysilicon gate applications. The process is especially useful in split-gate flash memory applications.

40 Claims, 7 Drawing Sheets

US 6,358,827 B1

METHOD OF FORMING A SQUARED-OFF, VERTICALLY ORIENTED POLYSILICON SPACER GATE

BACKGROUND OF THE INVENTION (1) Field of the Invention

The invention relates to processes for the manufacture of semiconductor devices and more particularly to processes for forming polysilicon gate field effect transistors.

(2) Background to the Invention and Description of Related Art

Computer memory consist of vast arrays of storage cells which can be addressed by wordlines and bitlines. The most commonly used DRAM (dynamic random access memory) cell design comprises a transfer gate (usually an MOS field-effect-transistor (MOSFET) and a storage node consisting of a capacitor plate connected to the MOSFET drain. Memory cells for ROMs (read only memories), PROMS (programmable ROMs) and EEPROMs (electrically erasable PROMS) are similarly arranged in rectangular arrays and are addressed by wordlines and bitlines but typically have their storage nodes formed by a floating gate which lies subjacent to an addressable control gate. Memory cells require a high cell density in order to achieve high performance and cost efficiency.

The simplicity of cell design permits the interconnection of elements of the transfer MOSFET, thereby permitting simpler and more effective array design. Conventionally, the control gates of all the MOSFETs in a wordline are formed of a single polysilicon band, traversing alternately over field oxide and cell gate regions. Likewise, the sources of the MOSFETs in a DRAM bitline string may be formed of a single diffusion or individual source diffusions, isolated by field oxide, may be interconnected by a superjacent addressable bitline. The interconnection of source elements by a diffusion band is found in EEPROM memory arrays. The drains of each of the MOSFETs must however remain unique and therefore electrically isolated.

A flash memory cell is descended from an EEPROM, having a floating gate which is charged and discharged, by trapping and releasing channel hot electrons emitted from the source through an ultra thin tunnel dielectric. A sufficient hot electron flow is achieved by biasing the control gate to produce a high source/drain current. Traditionally, floating gates and control have been formed by photolithographically patterning a deposited polysilicon layer. The minimum achievable planar dimensions are thereby limited by the photolithographic resolution of the technology. Keschtbod, U.S. Pat. No. 5,479,368 shows a method of avoiding the photolithographic resolution limit by forming a floating gate using sidewall technology. The minimum planar width of the floating is thereby essentially determined by the thickness of the conformal polysilicon layer from which the floating gate is formed. Ogura, U.S. Pat. No. 6,074,914 shows another process for forming a floating gate of split gate flash transistor from a polysilicon sidewall.

While the floating gate is completely isolated from other cell components, there is no need to make further connection to it. The floating gate is also small, each unit being confined to a single cell. Unlike the control gate which is part of a relatively long wordline, the floating gate conductivity need not be reinforced by silicidation as does the control gate.

Morihara, U.S. Pat. No. 5,404,038 shows a control gate of a memory cell with a circular design formed from a polysilicon sidewall. The polysilicon sidewall control gate is formed in the corner of a step formed by an opening in an epitaxial layer. The oxide gate dielectric extends beneath both the bottom and side of the polysilicon sidewall. The polysilicon which extends over the field isolation is masked by photoresist during sidewall etching to form a broader wordline which is attached a narrower gate element over the active region which has a curved profile. Because this is a corner structure without self-aligned LDD regions, and is connected to broader polysilicon wordlines which can be contacted in the conventional manner, there is no need to have a rectangular cross section of the section which traverses over the channel.

He, et. al. U.S. Pat. No. 6,063,668 shows a process for sealing recesses with polysilicon spacers in order to prevent the formation of ONO fences and polysilicon stringers, cause by mis-alignment of a polysilicon etch. Wu, U.S. Pat. No. 6,010,934 shows a method using free standing polysilicon spacers as a mask for making a silicon oxide hardmask which in turn is used to etch tiny silicon islands for single electron transistors. The polysilicon spacers are used as formed, having a curved taper on the side opposite to the step on which they were formed.

A major source of problems in using a sidewall structure as a conductive element in an integrated circuit, is the natural taper of the sidewall. Unlike patterned elements which have planar upper surfaces which can be easily treated and contacted in further processing steps, the natural sidewall taper is not compatible with such procedures. While a masking procedure to provide a broader conductive stripe over field isolation could satisfactorily address interconnection problems, the formation of insulative sidewalls to protect implanted LDD regions from a source/drain implant would be compromised by a non-rectangular sidewall gate structure. For example, in a self-aligned polysilicon gate MOSFET formed by a salicide process would present gate-to-source/drain bridging problems if the gate were formed by the conventional sidewall etching process. In addition, insulative sidewall formed along the edges of a polysilicon gate formed the conventional sidewall process would not be symmetrical. This will be shown in the following illustration:

Referring to FIGS. 1A through 1E, there are shown the processing steps that would be used to form a polysilicon control gate over a gate oxide by a sidewall process using the conventional methods taught to form a polysilicon floating gate. In FIG. 1A, an oxide layer 12 is patterned over a silicon wafer 10 by anisotropic etching to form a step 13. A thin gate oxide 14 is then grown on the exposed silicon. Next a conformal polysilicon layer 16 is deposited, typically by a CVD (chemical vapor deposition) method. Referring next to FIG. 1B, the polysilicon layer 16 is anisotropically etched back to the oxide leaving a sidewall portion 17 next to the step 13.

The width "w" of the polysilicon sidewall at it's base where it contacts the gate oxide is a critical dimension of the control gate, determined by the device design. Consequently The initial thickness of the polysilicon layer is chosen achieve this width. In order to form LDD (lightly doped drain) regions by the conventional self-aligned MOSFET process, the oxide layer 12 and the exposed portion of the gate oxide 14 are removed by wet etching or by plasma etching, leaving a free standing polysilicon sidewall gate electrode 17. This is illustrated in FIG. 1C. LDD regions 18 are then formed by implanting impurities, for example arsenic, if the wafer 10 is p-type.

At this stage of processing the cross section of the MOSFET appears normal and conventional except for the curved taper on one side of the polysilicon gate electrode 17. If conventional processing, that is forming oxide sidewalls, implanting a source/drain, and silicidation, were to continue, serious problems would occur. Referring to FIG. 1D a conformal oxide has been deposited and anisotropically etched back in the manner of a conventional gate sidewall process. Unlike the conventional result, however, if anisotropic etching is halted when the silicon substrate is reached, essentially no top portion of the polysilicon gate is exposed. It would therefore require an over-etch in order to drive the oxide sidewalls 19 further down along the sides of the polysilicon gate 17. The resulting cross section is shown in FIG. 1E. An additional problem is that the oxide sidewalls 19 are unsymmetrical and would result in unequal LDD lengths on each side of the gate.

If the oxide sidewalls are further driven down by over etching in order to exposed a portion of the polysilicon at the top, as shown in FIG. 1E, the length of oxide sidewall surface becomes smaller and the likelihood of gate-to-source/drain bridging by the later formed silicide increases, resulting in gate-to-source drain shorts.

Clearly the unsymmetrical polysilicon sidewall, although usable as a floating gate, is not desirable as a control gate of a MOSFET. It would therefore be of great benefit to have a simple method for forming a polysilicon gate from a polysilicon sidewall gate with little or no curved taper and with a relatively flat top to more closely resemble the profile of a conventional patterned polysilicon gate. The method taught by this invention achieves this result by "squaring off" the top of a polysilicon sidewall element so that it is more like a conventionally patterned gate and can be further processed in the conventional manner. The expression "squaring off" or "rectangularizing" as used in the context of this invention, will be specifically addressed towards improving the cross sectional rectangularity of a sidewall structure formed by a conventional sidewall process, thereby making the outer lateral wall of the sidewall more vertical and the top more horizontal.

SUMMARY OF THE INVENTION

It is an object of this invention to provide a method for forming a gate electrode of a MOSFET from a polysilicon sidewall structure.

It is another object of this invention to provide a method for squaring or rectangularizing a sidewall structure.

It is yet another object of this invention to provide a method for forming a device element, having an essentially rectangular cross section and wherein the planar width of the element is not limited by photolithographic resolution.

These objects are achieved by depositing a sacrificial oxide layer on a silicon wafer substrate. The thickness of the sacrificial oxide determines the thickness of the subsequently formed polysilicon gate electrode. The sacrificial oxide is masked and etched to the silicon to form a vertical walled step. A gate oxide is grown on the exposed silicon adjacent to the step and a blanket conformal polysilicon layer is deposited on the wafer. A thin silicon nitride layer is then conformally deposited on the polysilicon layer. Next a flowable material such as SOG (spin-on-glass) or photoresist is spin coated onto the wafer and cured, whereupon the flowable material fills in the valley adjacent to the step with relatively little deposit over the step itself.

In a first embodiment of this invention a truly rectangular cross section of the sidewall polysilicon structure is achieved. After curing the flowable material, the wafer surface is planarized by CMP (chemical mechanical polishing) and the surface is polished down until the silicon nitride/polysilicon interface at the upper surface just extends a distance from the step that corresponds to the desired gate width. The remaining SOG is then removed and the exposed polysilicon is selectively oxidized, using the silicon nitride which remained beneath the remaining SOG as an oxidation mask. The oxide then becomes a hardmask to anisotropically etch the polysilicon, partially down to the gate oxide, forming a vertical polysilicon sidewall spaced away from and parallel to the riser of the sacrificial oxide step. The oxide hardmask is then removed and the polysilicon is further anisotropically etched to the top of the sacrificial oxide step and the gate oxide. The sacrificial oxide is etched away leaving a polysilicon gate electrode with a near perfect rectangular cross section. Conventional processing can then proceed, for example by ion implanting LDD regions on both sides, of the polysilicon gate.

While the first embodiment provides a truly rectangular polysilicon cross section, it requires surface planarization, either by CMP or by controlled plasma etching. This adds considerable complexity to the process and further requires a highly accurate means for endpoint detection in order to achieve sufficient control of the gate width critical dimension. Planarization processing has become a valuable tool in present day semiconductor manufacturing technology. It's widespread application in wafer processing has fostered considerable advances in endpoint detection. These include both in-situ monitoring techniques as well as off-table sampling measurements for CMP. In addition, material removal rates may now be controlled with such precision that a timed planarization, either by CMP or plasma etchback, may be employed to reach a desired planarized level.

In a second embodiment, the planarization of the polysilicon/SOG blanket is omitted and the resultant polysilicon sidewall structure has parallel vertical sides and a slight taper on the top surface. This embodiment offers a compromise which affords a "nearly rectangular" or "squared off" polysilicon gate cross section without the added process complexity of planarization processing. In the second embodiment the conformal polysilicon layer over a step in a sacrificial oxide deposited to a thickness which is just greater than the desired height of the final polysilicon gate. A thin silicon nitride cap is then deposited onto conformal polysilicon layer and portions of the cap are selectively etched away without photolithography, using a flowed mask such as photoresist or SOG. The regions of polysilicon exposed by the selective etching are then oxidized to form a hardmask. The oxide hardmask extends over the edge of the step by a distance which defines the final width of the polysilicon sidewall. Using this oxide hardmask, the silicon nitride and a major portion of the polysilicon are anisotropically blanket etched, thereby forming a vertical sidewall on the step. The oxide hardmask is then removed and the polysilicon is further anisotropically etched to expose the top of the step as well as the gate oxide. In the process just described, an upper portion of the polysilicon is removed without the use of photolithography, leaving a slightly angled by flat top on the polysilicon sidewall structure. The profile of the polysilicon distal to the step is made essentially vertical by the anisotropic etching.

DESCRIPTION OF THE PREFERRED EMBODIMENTS

In the embodiments two methods for forming a "squared off" polysilicon sidewall element are described. The first embodiment shows the formation of an essentially perfectly rectangular sidewall which becomes the gate electrode of a simple MOSFET. The second embodiment forms a squared off sidewall with a slightly rounded top portion. The second embodiment is considerably less complex than the first embodiment in that it does not require planarization processing. However, the resultant sidewall profile is acceptable in most gate design applications.

Figure 2A:
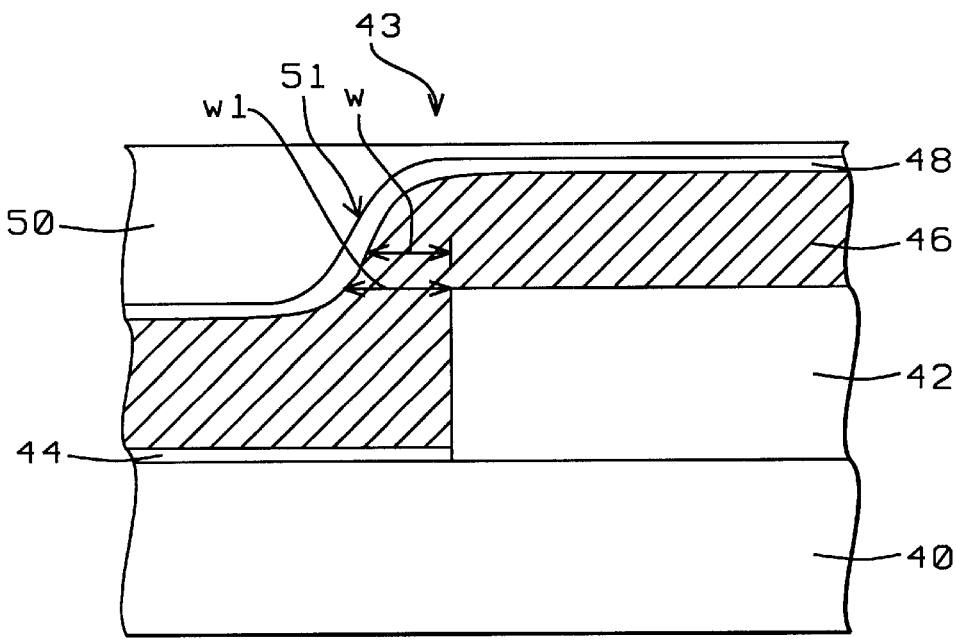
FIG. 2A through FIG. 2F show cross sections of process steps used to form a MOSFET by a first embodiment of this invention.

Referring to FIG. 2A a p-type monocrystalline <100> oriented silicon wafer substrate 40 is provided. Shallow trench field isolation regions (not shown) are formed in the surface of the wafer 40 by conventional processing. A sacrificial silicon oxide layer 42, between about 200 and 300 nm.(nanometers) thick is deposited onto the wafer 40 by conventional methods, either by thermal oxidation or by a CVD (chemical vapor deposition) method. The oxide layer 42 is photolithographically patterned with anisotropic etching to form a vertical step 43. A thin oxide layer 44 is grown to a thickness of between about 5 and 30 nm. by thermal oxidation over the exposed silicon to the left of the step 43. In the present invention wherein a MOSFET is to be formed, the oxide layer 44 is the gate oxide of the MOSFET. In an instance wherein a rectangularized polysilicon sidewall is to be formed for another application, it is still necessary to form the thin oxide layer 44 because it will be used as an etch stop in later processing. A polysilicon layer 46 is deposited onto the wafer by a conformal deposition method, preferably by PECVD (plasma enhanced CVD) of polysilicon layers by CVD methods is well known and widely practiced in the art. The thickness of the polysilicon layer 46, in the embodiments of this invention is not constrained by the final design width of the polysilicon gate. However, in order to optimize critical dimension control of the polysilicon gate width, it is important to maximize the sacrificial oxide-to-polysilicon thickness. This is accomplished by applying only a minimal thickness of polysilicon, thereby maximizing this thickness ratio, the tangential slope of the polysilicon surface at the point 51 will be maximized, thereby affording optimal endpoint sensitivity during the subsequent planarization step. In the present embodiment, the polysilicon layer 46 is preferably deposited to a thickness just sufficient to obtain a lateral thickness "w" above the top surface of the sacrificial oxide 42. "w" is the final desired gate electrode width. Because the polysilicon is tapered in this region, the lateral thickness "w1" at the sacrificial oxide surface plane is just slightly greater than the final gate electrode width "w". In the present embodiment, the polysilicon layer 46 is deposited to a thickness of between about 100 and 200 nm. This affords a sacrificial oxide-to-polysilicon thickness ratio of between about 1:1 and 3:1.

A silicon nitride layer 48, between about 10 and 50 nm. thick, is next conformally deposited by a CVD method such as PECVD, onto the polysilicon layer 46 using a conventional chemistry and deposition parameters. A flowable material, preferably a SOG 50 is deposited over the silicon nitride layer 48 using a spin on process. The SOG 50 is deposited by a nozzle directed at the center of a rapidly spinning wafer. Centrifugal force distributes the liquid over the wafer, filling in the topographic features and leaving a substantially flat and planar upper surface. Excess liquid is flung from the edge of the wafer. The wafer is then baked to drive out the solvents and cure the SOG. The SOG is deposited to a level at least above the plane of the top of the step 43 and preferably to just above the highest surface of the polysilicon layer 46 as shown in FIG. 2A.

In the alternative other materials that can be applied in liquid form and subsequently hardened or cured to form a solid layer, for example photoresists or polyimides, may be used in place of the SOG.

Figure 2B:
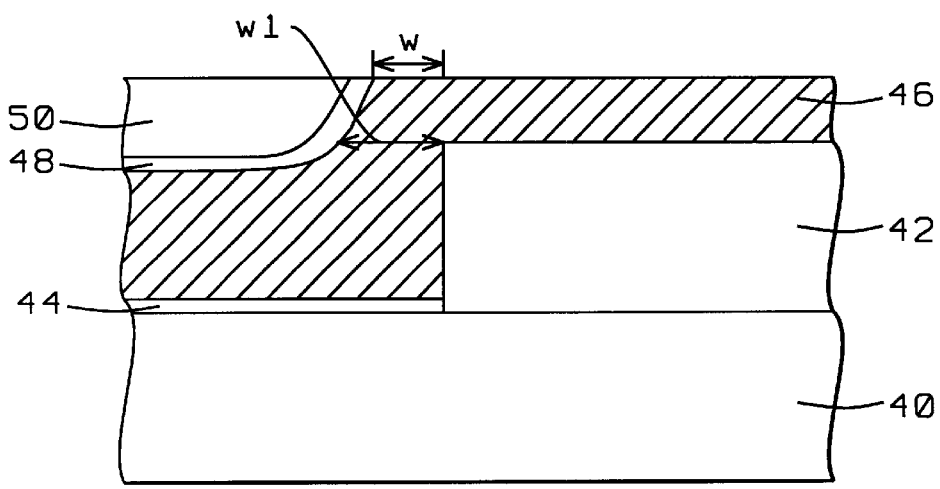

Referring to FIG. 2B, the surface of the wafer 40 is planarized, preferably by CMP (chemical mechanical polishing). In CMP, the wafer is placed on a rotating table and contacted with a flat, cloth covered polishing head. An abrasive slurry is dispensed onto the wafer surface and polishing proceeds to form a new surface in which the polysilicon/silicon nitride interface at the new wafer surface is brought laterally out to a distance "w" from a point corresponding to the vertical projection of the edge of the step 43 on the new surface. The distance "w" is the design width of the to-be-formed gate electrode. In the embodiments of this invention the design or target width "w" is between about 10 and 30 nm.

As the slope at the polysilicon/nitride interface deviates from the vertical, the ability to achieve a precise endpoint becomes more difficult because the dimension "w" varies rapidly with the planarized thickness. Thus in order to obtain good dimensional control of the gate width "w", the slope at "w" should be as steep as possible. An optimally steep slope can be realized by minimizing the initial polysilicon thickness.

In the alternative, the wafer surface may be brought to proper distance by etch back planarization. In etch back planarization. the surface of the wafer is etched in a plasma reactor, preferably by RIE (reactive ion etching) under conditions and with an etching chemistry and conditions which etch the SOG, the silicon nitride, and the polysilicon at the same rate. Etch chemistries and conditions for etching these materials are well known and suitable conditions to establish a common etch rate may by found by conventional optimization methods.

Figure 2C:
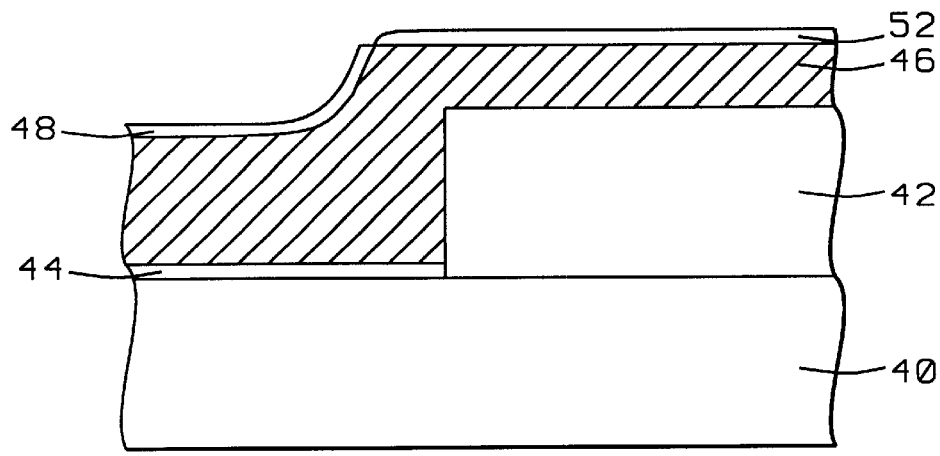

Referring now to FIG. 2C, a silicon oxide layer 52 is selectively grown to a thickness of between about 10 and 50 nm. on the polysilicon layer surface exposed by the planarization process, by the well known LOCOS (local oxidation of silicon) process using the remaining silicon nitride layer 48 as an oxidation mask. After the oxide 52 is formed, the remaining silicon nitride 48 is removed, preferably by conventional plasma etching. Alternately the residual nitride layer 48 may be removed by wet etching with $H_3PO_4$ heated to between about 180 and 195° C. This etchant is often used to selectively remove silicon nitride. In a further alternative, the residual silicon nitride 48 may be left in place and removed at the start of a subsequent polysilicon etch in which the oxide layer 52 is used as a hardmask to anisotropically etch the polysilicon layer. Etchant gases having high nitride/oxide selectivities, for example containing $NF_3$, may be applied to remove the nitride layer 48 followed by an etchant gas rich in $Cl_2$ or HBr to etch the subjacent polysilicon layer 46.

Figure 2D:
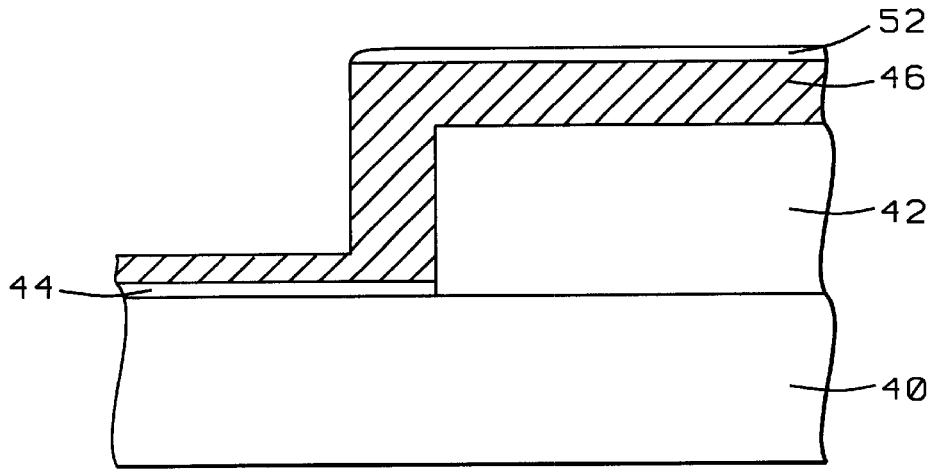

Referring to FIG. 2D, the wafer is loaded into the chamber of an RIE etching tool and the polysilicon layer 46 is etched by RIE until between about 10 and 20 percent of it's original thickness remains over the gate oxide 44. An etchant gas containing chlorine or HBr is used to anisotropically etch the polysilicon. Etchant chemistries and conditions for anisotropically etching polysilicon with a silicon oxide hardmask are well known in the art. The residual silicon oxide hardmask 52 is now removed, preferably within the same etching tool and without breaking vacuum, by changing the RIE etchant containing a fluorocarbon, for example $CF_4$ or $CHF_3$, or a mixture of fluorocarbons. Alternately, the oxide hardmask 42 may be removed by wet etching in dilute aqueous HF and then re-loaded into the etching tool to complete the polysilicon etch.

Figure 2E:
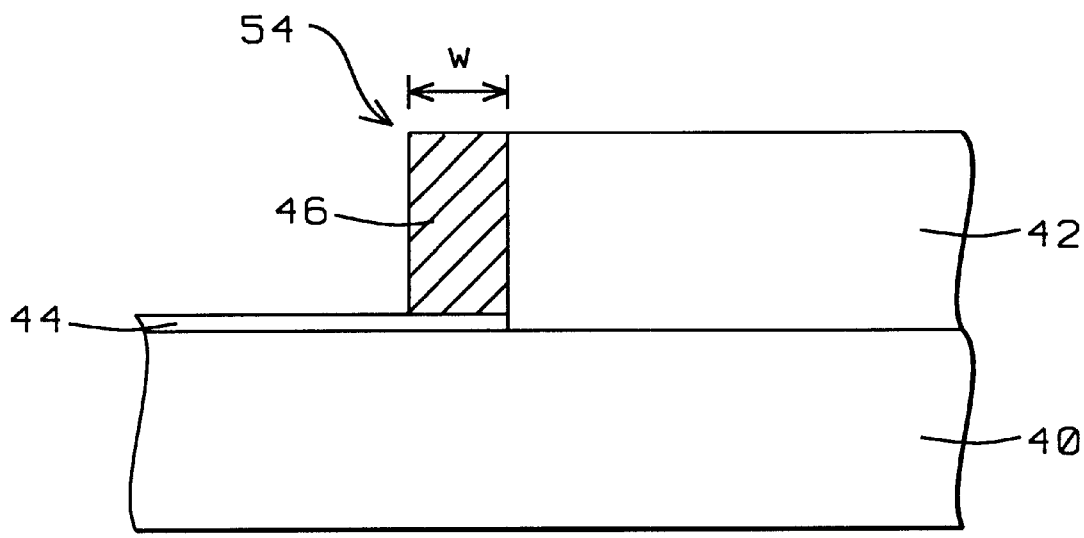

After the oxide hardmask 52 is removed, the polysilicon etchant gases are returned and polysilicon etching is continued until the gate oxide 44 and the sacrificial oxide 42 is reached. In order to obtain good etch stopping characteristic an etchant gas with a high polysilicon-to-oxide selectivity etchant composition is used. Such compositions are well known and contain HBr as the primary etchant. A 20 to 40% over etch is applied to assure the thorough removal of polysilicon in the etched region. The upper surface of the completed polysilicon gate 54 will be slightly recessed below the surface plane of the sacrificial oxide 42 from the over etch. This can be easily compensated for by depositing the sacrificial oxide 42 slightly thicker at the start. FIG. 2E shows the now completed polysilicon gate structure 54 with the desired width "w".

Figure 2F:
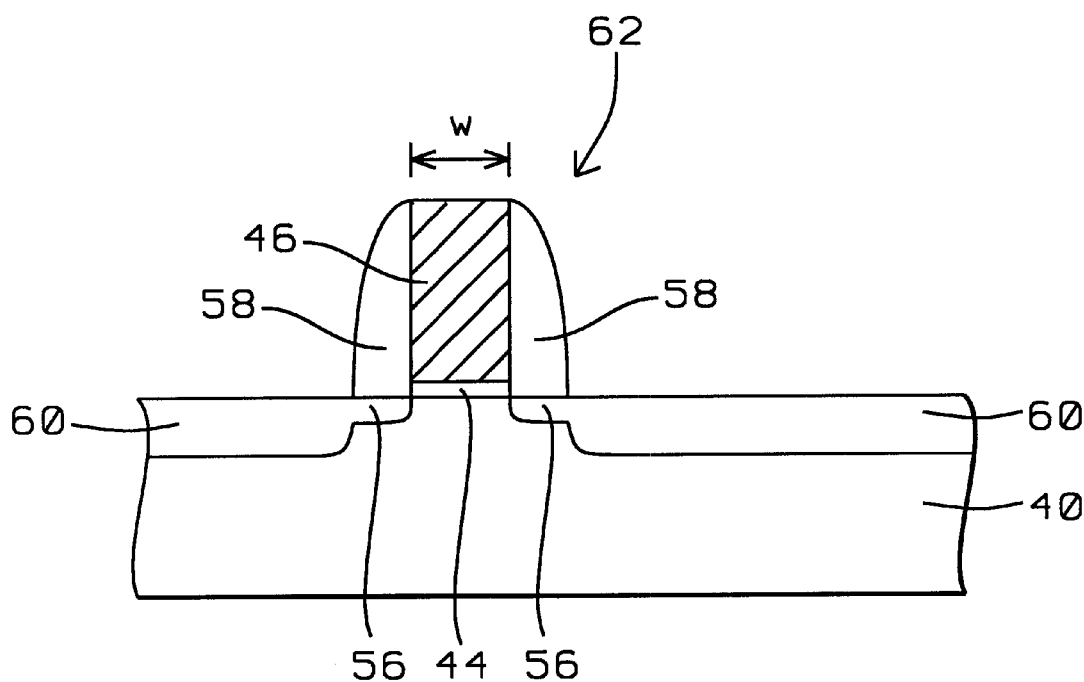

In the preferred process, the residual silicon nitride 48, the first and second polysilicon etching with the intermediate removal of the silicon oxide layer 52 are all successively performed within the RIE tool in a single pumpdown (without breaking vacuum), thereby simplifying the process as well as reducing the amount of wafer handling and improving product yield. After completion of the polysilicon gate etch, the sacrificial oxide 42 and exposed gate oxide 44 are removed, preferably by a dip etch in dilute aqueous HF. Subsequent processing is now conventional and typically consists of ion implanting a dose of n-type impurity atoms to form LDD regions 56, forming conventional insulative sidewalls 58 and then ion implanting a second dose of n-type impurity atoms to form source/drain regions 60, thereby forming a MOSFET 62 which is shown in FIG. 2F. Ion implantation procedures are well known in the art.

In a second embodiment, the planarization of the polysilicon/SOG blanket is omitted and while the resultant polysilicon sidewall structure has parallel vertical sides the top surface is slightly tapered away from the step. In most applications this tapered top surface can be tolerated and a "nearly rectangular" polysilicon gate cross section may be preferred. Thus the second embodiment may be therefore be preferred because it does not use planarization processing thereby making it far more cost effective less complex than the first.

Figure 3A:
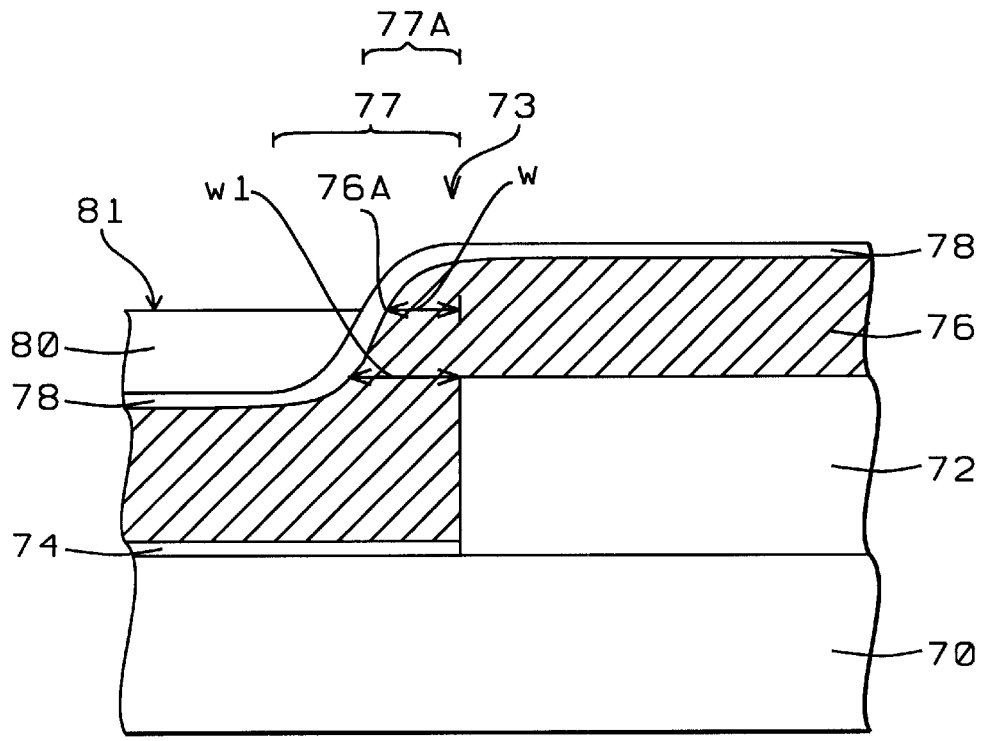
FIG. 3A through FIG. 3G show cross sections of process steps used to form a MOSFET by a second embodiment of this invention.

Referring to FIG. 3A, a p-type <100> oriented monocrystalline silicon wafer 70 is provided. As in the first embodiment, shallow trench field isolation regions (not shown) are formed in the surface of the wafer 70 by conventional processing wherein a trench is etched in the wafer surrounding a region wherein a MOSFET is to be formed. The trench is filled with an insulative material, for example silicon oxide which electrically insulated the perimeter of the MOSFET from surrounding circuitry.

A sacrificial silicon oxide layer 72, between about 200 and 300 nm. thick is deposited onto the wafer 70 by conventional methods, either by thermal oxidation or by a CVD method.

The oxide layer 72 is photolithographically patterned with anisotropic etching to form a vertical step 73. A thin oxide layer 74 is grown to a thickness of between about 5 and 30 nm. by thermal oxidation over the exposed silicon to the left of the step 73. In the present invention wherein a MOSFET is to be formed the oxide layer 74 is the gate oxide of the MOSFET. In an instance wherein a rectangularized polysilicon sidewall is to be formed for another application, it is still necessary to form the oxide layer 74 because it will be used in later processing as an etch stop.

A polysilicon layer 76 is deposited onto the wafer by a conformal deposition method, preferably by PECVD. The thickness of the polysilicon layer, in the embodiments of this invention is not constrained by the final design width of the polysilicon gate but it has an effect on the precision to which the gate width can be controlled. In the present embodiment, the polysilicon layer 76 is deposited to a thickness whereby the lateral thickness "w1" is greater than the final sidewall base width "w" which corresponds to the target polysilicon gate width. In the embodiments of this invention the design or target gate width "w" is between about 15 and 20 nm.

By making the polysilicon layer 76 thicker, the step 77 on the upper surface of the layer 76 is further broadened and that portion "77A" of the step 77, over the location where the control gate will later be formed, becomes more co-planar with the wafer surface. This will result in a flatter top surface of the polysilicon gate. However, as the polysilicon layer becomes thicker, the polysilicon/sacrificial oxide thickness ratio decreases and the ability to control the gate width critical dimension in subsequent processing becomes more difficult. In the present embodiment, the polysilicon layer 76 is deposited to a thickness of between about 100 and 200 nm. This affords a sacrificial oxide-to-polysilicon thickness ratio of between about 1:1 and 3:1.

A silicon nitride layer 78, between about 10 and 50 nm. thick, is next conformally deposited by a CVD method such as PECVD, onto the polysilicon layer 76 using a conventional chemistry and deposition parameters. A flowable material, preferably a SOG 80 is deposited over the silicon nitride layer 78 using a spin on process. The SOG 80 is deposited by a nozzle directed at the center of a rapidly spinning wafer. Centrifugal force distributes the liquid over the wafer, filling in the topographic features to a level whereby the final cured SOG surface 81 will be at a level corresponding to the point 76A on the silicon nitride/polysilicon interface which is a lateral distance "w" away from plane of the step 73 riser is equal to the desired final polysilicon gate width. Excess liquid is flung from the edge of the wafer. The wafer 70 is then baked to drive out solvents and cure the SOG 80. The SOG 80 is deposited to a top surface level 81 preferably at, or alternately, slightly above, the level wherein the edge 76A of the polysilicon layer 76 extends laterally a distance "w" (the target gate width) beyond the edge of the step 73 as shown in FIG. 3A.

If the top surface 81 of the cured SOG layer 80 is slightly above the level wherein the edge of the polysilicon layer 76 extends laterally a distance "w" beyond the edge 76A of the step 73, an etchback step is used to drive the SOG surface down to that level. The etchback step consists of a plasma etch using an etchant gas, for example one containing fluorocarbons, and etching parameter which afford a high SOG-to-silicon nitride etch rate selectivity. Plasma etchants and etching parameters for achieving these conditions are well known in the are and may be experimentally optimized for the particular SOG used. Corresponding etchants and parameters to selectively etch alternative flowable materials are also well known.

In the alternative other materials that can be applied in liquid form and subsequently hardened or cured to form the flowed layer 80, for example photoresists or polyimides, may be used in place of a SOG.

Figure 3B:
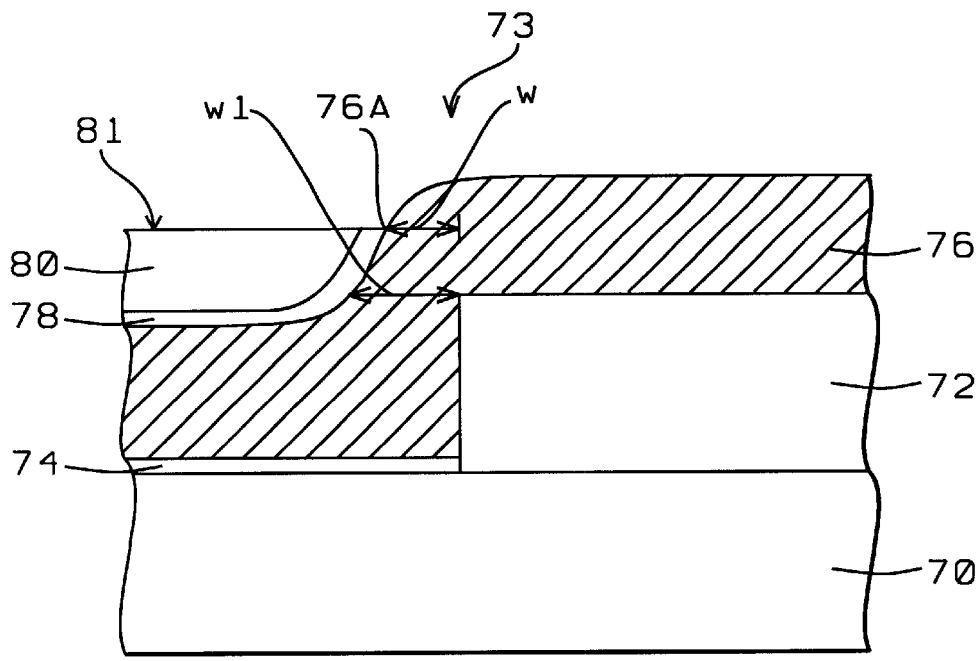

Referring to FIG. 3B, with the surface 81 of the SOG layer 80 at the level 76A, the silicon nitride layer 78 is selectively etched away from over the polysilicon layer 76 where it is not covered by the SOG layer 80, preferably by conventional plasma etching. This plasma etching step may be combined with the preceding plasma SOG etchback step; that is, the SOG etchback and the selective silicon nitride plasma etch may be performed sequentially in the same etching tool in a single pumpdown operation. Alternately the exposed nitride layer 78 may be removed by wet etching with $H_3PO_4$ heated to between about 180 and 195° C.

Figure 3C:
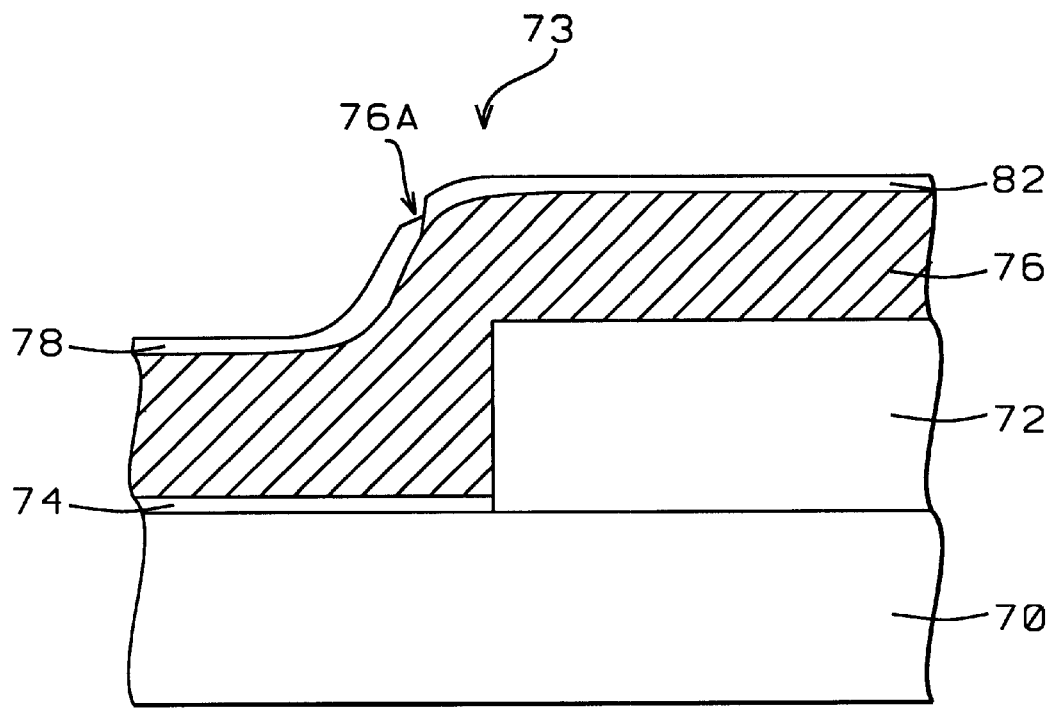

Referring now to FIG. 3C, the SOG layer 80 is removed, preferably by wet etching with dilute aqueous HF, exposing the subjacent silicon nitride layer 78 which will now be used as a hardmask to form a thermal silicon oxide layer. A silicon oxide layer 82 is selectively grown to a thickness of between about 10 and 50 nm. on the exposed polysilicon layer 76 surface, by the LOCOS process using the remaining silicon nitride layer 78 as an oxidation mask. After the oxide 82 is formed, the remaining silicon nitride 78 is removed, preferably by conventional plasma etching. Alternately, the residual nitride layer 78 may be removed by wet etching with $H_3PO_4$ heated to between about 180 and 195° C. In a further alternative, the residual silicon nitride 78 may be left in place and removed at the start of a subsequent polysilicon etch in which the oxide layer 82 is used as a hardmask to anisotropically etch the polysilicon layer 76. Etchant gases having high nitride/oxide selectivities, for example containing $NF_3$, may be applied to remove the nitride layer 78 followed by an etchant gas containing $Cl_2$ or HBr to etch the subjacent polysilicon layer 76.

Figure 3D:
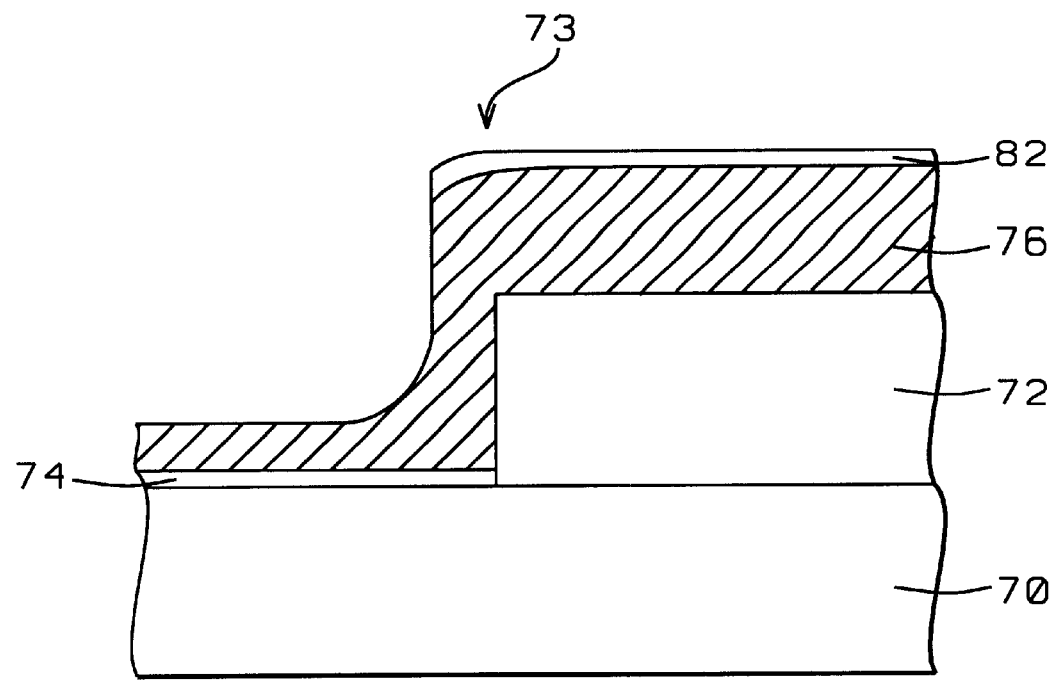

Referring to FIG. 3D, the wafer is loaded into the chamber of an RIE etching tool and the polysilicon layer 76 is etched by RIE until between about 10 and 20 percent of it's original thickness remains over the gate oxide 74. An etchant gas containing chlorine or HBr is used to anisotropically etch the polysilicon. Etchant chemistries and conditions for anisotropically etching polysilicon with a silicon oxide hardmask are well known in the art. The residual silicon oxide hardmask 82 is now removed, preferably by changing the RIE etchant containing a fluorocarbon, for example $CF_4$ or $CHF_3$, or a mixture of fluorocarbons. Alternately, the oxide hardmask 82 may be removed by wet etching in dilute aqueous HF and then re-loaded into the etching tool to complete the polysilicon etch.

Figure 3E:
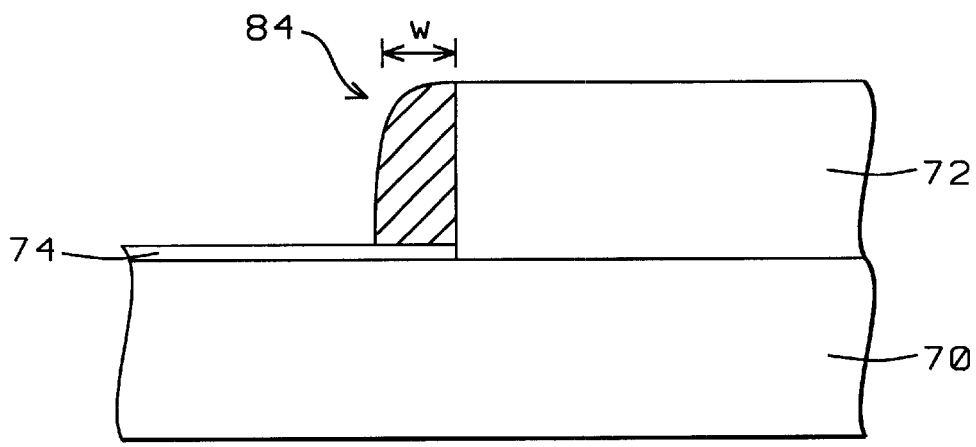

After the oxide hardmask 82 is removed, polysilicon etchant gases are returned and polysilicon etching is continued until the gate oxide 74 and th e sacrificial oxide 72 is reached. In order to obtain good etch stopping characteristic an etchant gas with a high polysilicon-to-oxide selectivity etchant composition is used. Such compositions are well known and contain HBr as the primary etchant. A 20 to 40% over etch is applied to assure the thorough removal of polysilicon in the etch region. Because the upper surface of the completed polysilicon gate 84 will be slightly recessed below the surface plane of the sacrificial oxide 72. This can be easily compensated for by depositing the sacrificial oxide 72 slightly thicker at the start. FIG. 3E shows the now completed polysilicon gate structure 84 with the desired width "w". The as deposited polysilicon layer has a slightly downward curvature which begins directly above the step 73. This downward curvature is replicated on the top of the final gate structure 84.

Figure 1A:
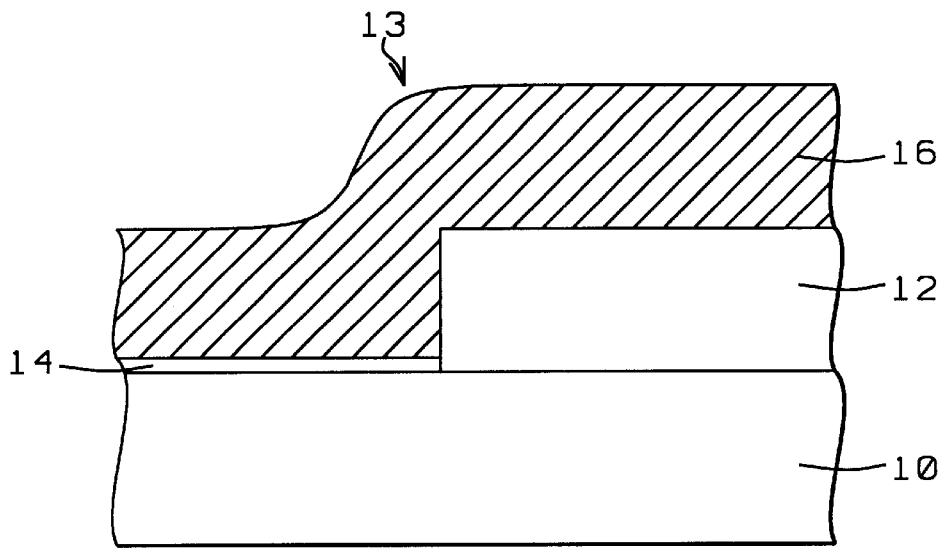
FIGS. 1A through FIG. 1E are cross sections showing the process steps and illustrating the problems of a process wherein a polysilicon control gate of a MOSFET is formed using a sidewall process which has been used to form a floating polysilicon gate of an EEPROM.
Figure 1B:
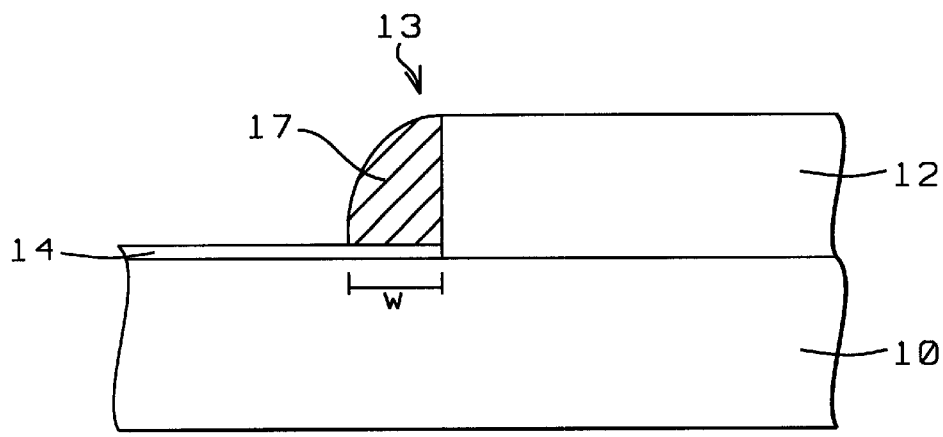
Figure 1C:
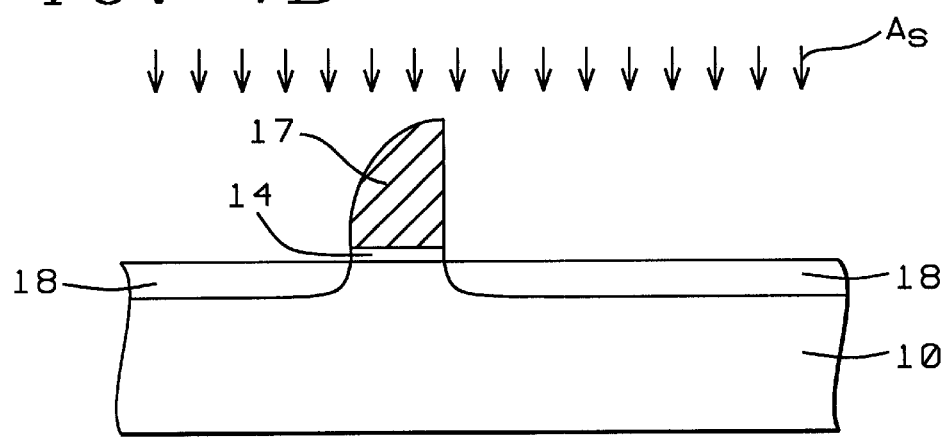
Figure 1D:
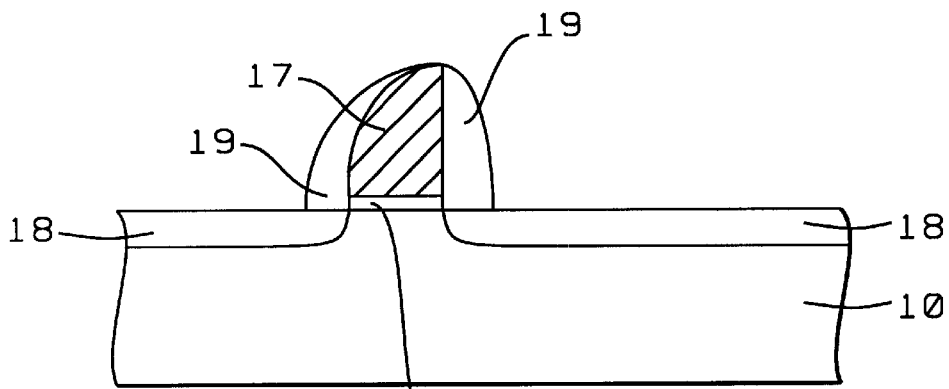
Figure 1E:
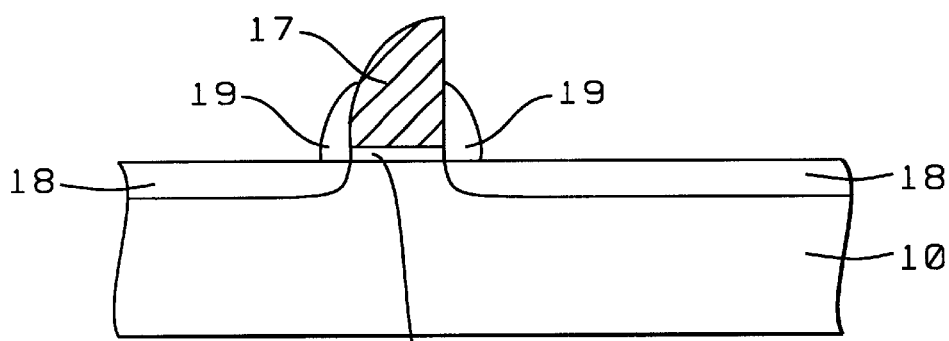
Figure 3F:
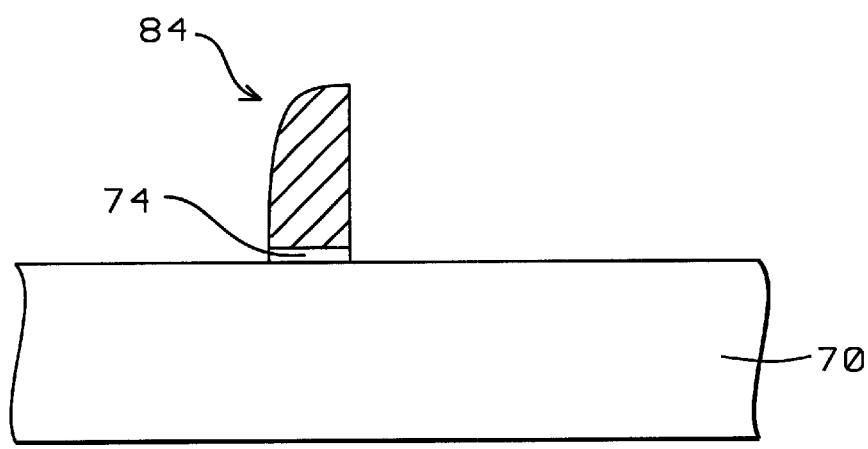
Figure 3G:
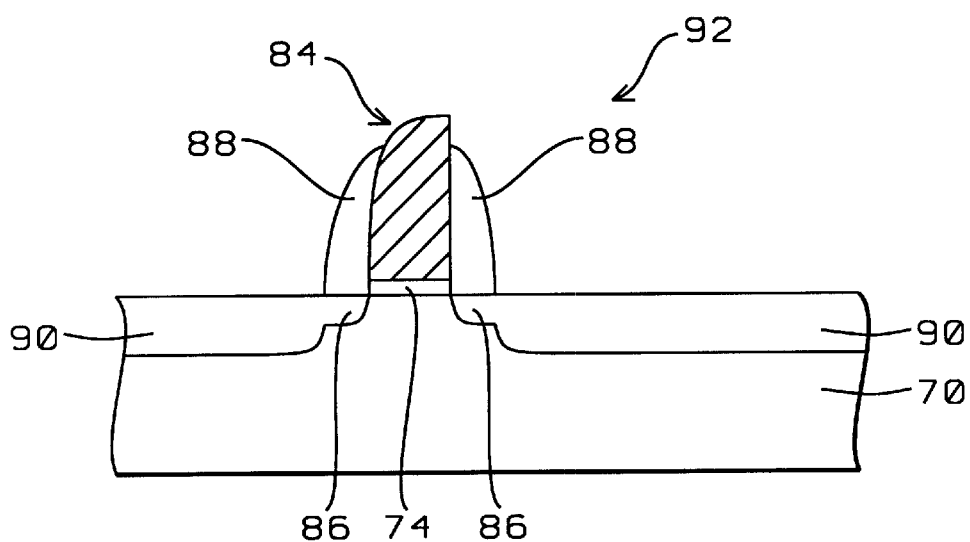

Referring to FIG. 3F, after completion of the polysilicon gate etch, the sacrificial oxide 72 and exposed gate oxide 74 are removed, preferably by a dip etch in dilute aqueous HF. Subsequent processing is now conventional and typically consists of ion implanting LDD regions 86, forming conventional insulative sidewalls 88 and implanting source/drain regions 90, thereby forming a MOSFET 92 which is shown in FIG. 3G. Unlike the first embodiment, wherein the polysilicon gate is essential flat on top, the sidewalls 88 must be etched down to a slightly lower level in order to fully expose the curved top gate structure. Nevertheless, the gate structure 84, although less squared off than that of the second embodiment, is obviously far superior in cross sectional shape than a gate structure formed using simple sidewall technology as illustrated in FIG. 1E.

While this invention has been particularly shown and described with reference to the preferred embodiment thereof, it will be understood by those skilled in the art that various changes in form and details may be made without departing from the spirit and scope of the invention. While the embodiments of this invention utilize a p-type silicon substrate, with n-type implanted impurities, an n-type silicon substrate, with p-type implanted impurities could also be used without departing from the concepts therein provided.

What is claimed is:

1. A method for forming a polysilicon sidewall with a rectangular cross section comprising:

(a) providing a silicon wafer having a first silicon oxide layer;

(b) patterning a vertical step in said first silicon oxide layer, thereby exposing a silicon region;

(c) forming an etch stop over said silicon region;

(d) depositing a polysilicon layer on said wafer, whereby the lateral thickness of said polysilicon layer at the top of said step is greater than a target width of a to-be-formed polysilicon sidewall;

(e) forming a silicon nitride layer over said polysilicon layer;

(f) depositing a flowable layer over said silicon nitride layer in an amount sufficient to cover the entire surface of said silicon nitride layer;

(g) curing said flowable layer;

(h) removing material from the surface of said wafer substrate by a planarizing process thereby exposing a portion of said polysilicon layer and forming a new surface in which the lateral thickness of said polysilicon layer extending along the new surface, from a point corresponding to the vertical projection of the edge of said step to said silicon nitride layer is essentially equal to said target width;

(i) removing residual said flowable layer;

(j) forming an second silicon oxide layer on said exposed portion of said polysilicon layer by thermal oxidation;

(k) removing residual said silicon nitride layer;

(l) performing a first anisotropic etching a of said polysilicon layer, using said second silicon oxide layer as a mask, thereby leaving a residual polysilicon thickness;

(m) removing said second silicon oxide layer; and (n) performing a second anisotropic etching of said polysilicon layer, thereby exposing said etch stop and said first silicon oxide layer, whereby a rectangular polysilicon sidewall remains alongside said step.

2. The method of claim 1 wherein said first silicon oxide layer is between about 200 and 300 nm. thick.

3. The method of claim 1 wherein said etch stop is silicon oxide and is between about 5 and 50 nm. thick.

4. The method of claim 2 wherein said polysilicon layer is between about 100 and 200 nm. thick.

5. The method of claim 1 wherein said target width is between about 10 and 30 nm.

6. The method of claim 1 wherein said silicon nitride layer is between about 10 and 50 nm. thick.

7. The method of claim 1 wherein said flowable layer is selected from the group consisting of a spin-on-glass, a photoresist, and a polyimide.

8. The method of claim 1 wherein said removing of residual said silicon nitride layer, said first anisotropic etching, said removing of said silicon oxide layer, and said second anisotropic etching, are successively performed in said etching tool without breaking vacuum.

9. The method of claim 1 wherein said silicon nitride layer is removed with $H_3PO_4$ heated to a temperature of between about 180 and 195° C.

10. The method of claim 1 wherein said planarization process is selected from the group consisting of chemical mechanical planarization and etchback planarization.

11. A method for forming a squared off polysilicon sidewall comprising:
(a) providing a silicon wafer having a first silicon oxide layer;
(b) patterning a vertical step in said first silicon oxide layer, thereby exposing a silicon region;
(c) forming an etch stop over said silicon region;
(d) depositing a polysilicon layer on said wafer, whereby the lateral thickness of said polysilicon layer at the top of said step is greater than a target width of a to-be-formed polysilicon sidewall;
(e) forming a silicon nitride layer over said polysilicon layer;
(f) depositing a flowable layer over said silicon nitride layer in an amount sufficient bring the surface level of said flowable layer, after curing, to or slightly above a first point on the exposed surface of said silicon nitride layer where the distance between a second point, a t the silicon nitride/polysilicon interface, located in a lateral direction, parallel to the plane of the wafer surface and perpendicular to the plane of the step riser, from the first point, and a third point, located in the plane of the step riser in the same lateral direction from said second point, is essentially equal to said target width;
(g) curing said flowable layer;
(h) after said curing, adjusting the level of said flowable layer, if necessary, to the bring the surface of said flowable layer to the level of said first point by a selective etchback process;
(i) removing a portion of said silicon nitride layer not covered by said flowable layer, thereby exposing a first region of said polysilicon layer;
(j) removing said flowable layer;
(k) forming an second silicon oxide layer on said first region by thermal oxidation of said polysilicon layer;
(l) removing residual said silicon nitride layer;
(m) performing a first anisotropic etching of said first region, using said second silicon oxide layer as a mask, thereby leaving a residual polysilicon thickness;
(n) removing said second silicon oxide layer; and
(o) performing a second anisotropic etching of said polysilicon layer, thereby exposing said etch stop and said first silicon oxide layer, whereby a polysilicon sidewall with near rectangular cross section and said target width remains alongside said step.

12. The method of claim 11 wherein said first silicon oxide layer is between about 200 and 300 nm. thick.

13. The method of claim 11 wherein said etch stop is silicon oxide and is between about 5 and 30 nm. thick.

14. The method of claim 12 wherein said polysilicon layer is between about 100 and 200 nm. thick.

15. The method of claim 11 wherein said target width is between about 10 and 30 nm.

16. The method of claim 11 wherein said silicon nitride layer is between about 10 and 50 nm. thick.

17. The method of claim 11 wherein said flowable layer is selected from the group consisting of a spin-on-glass, a photoresist, and a polyimide.

18. The method of claim 11 wherein said removing residual said silicon nitride layer, said first anisotropic etching, said removing said second silicon oxide layer, and said second anisotropic etching, are successively performed in a plasma etching tool without breaking vacuum.

19. The method of claim 11 wherein said silicon nitride layer is removed with $H_3PO_4$ heated to a temperature of between about 180 and 195° C.

20. The method of claim 11 wherein said planarization process is selected from the group consisting of chemical mechanical planarization and etchback planarization.

21. A method for forming a self-aligned polysilicon gate MOSFET comprising:
(a) providing a silicon wafer having an active silicon region of a first conductivity type surrounded by a field isolation, and a first silicon oxide layer;
(b) patterning a vertical step in said first silicon oxide layer, thereby exposing a portion of said silicon region;
(c) forming a gate oxide over said portion of said silicon region;
(d) depositing a polysilicon layer on said wafer, whereby the lateral thickness of said polysilicon layer at the top of said step is greater than a target width of a to-be-formed polysilicon gate;
(e) forming a silicon nitride layer over said polysilicon layer;
(f) depositing a flowable layer over said silicon nitride layer in an amount sufficient to cover the entire surface of said silicon nitride layer;
(g) curing said flowable layer;
(h) removing material from the surface of said wafer substrate by a planarizing process thereby exposing a portion of said polysilicon layer and forming a new surface in which the lateral thickness of said polysilicon layer extending along the new surface, from a point corresponding to the vertical projection of the edge of said step to said silicon nitride layer is essentially equal to said target width;
(i) removing residual said flowable layer;
(j) forming an second silicon oxide layer on said exposed portion of said polysilicon layer by thermal oxidation;
(k) removing residual said silicon nitride layer;
(l) performing a first anisotropic etching a of said polysilicon layer, using said second silicon oxide layer as a mask, thereby leaving a residual polysilicon thickness;
(m) removing said second silicon oxide layer;
(n) performing a second anisotropic etching of said polysilicon layer, thereby exposing said gate oxide and said first silicon oxide layer, whereby a rectangular polysilicon sidewall remains alongside said step;

(o) removing said exposed said gate oxide and residual said first silicon oxide layer thereby forming a polysilicon gate;

(p) implanting a first dose of impurity atoms of a second conductivity type into said wafer thereby forming lightly doped drain regions;

(q) forming insulative sidewalls on said polysilicon gate; and (r) implanting a second dose of impurity atoms of a second conductivity type into said wafer thereby forming source/drain regions and completing the formation of a MOSFET.

22. The method of claim 21 wherein said first silicon oxide layer is between about 200 and 300 nm. thick.

23. The method of claim 21 wherein said gate oxide and is between about 5 and 50 nm. thick.

24. The method of claim 22 wherein said polysilicon layer is between about 100 and 200 nm. thick.

25. The method of claim 21 wherein said target width is between about 10 and 30 nm.

26. The method of claim 21 wherein said silicon nitride layer is between about 10 and 50 nm. thick.

27. The method of claim 21 wherein said flowable layer is selected from the group consisting of a spin-on-glass, a photoresist, and a polyimide.

28. The method of claim 21 wherein said removing of residual said silicon nitride layer, said first anisotropic etching, said removing of said silicon oxide layer, and said second anisotropic etching, are successively performed in a plasma etching tool without breaking vacuum.

29. The method of claim 21 wherein said silicon nitride layer is removed with $H_3PO_4$ heated to a temperature of between about 180 and 195° C.

30. The method of claim 21 wherein said planarization process is selected from the group consisting of chemical mechanical planarization and etchback planarization.

31. The method of claim 21 wherein said exposed said gate oxide and residual said first silicon oxide layer are removed with dilute aqueous HF.

32. A method for forming a self-aligned polysilicon gate MOSFET comprising:

(a) providing a silicon wafer having an active silicon region of a first conductivity type surrounded by a field isolation, and a first silicon oxide layer;

(b) patterning a vertical step in said first silicon oxide layer, thereby exposing a portion of said silicon region;

(c) forming a gate oxide over said portion of said silicon region;

(d) depositing a polysilicon layer on said wafer, whereby the lateral thickness of said polysilicon layer at the top of said step is greater than a target width of a to-be-formed polysilicon gate;

(e) forming a silicon nitride layer over said polysilicon layer;

(f) depositing a flowable layer over said silicon nitride layer in an amount sufficient bring the surface level of said flowable layer, after curing, to or slightly above a first point on the exposed surface of said silicon nitride layer where the distance between a second point, at the silicon nitride/polysilicon interface, located in a lateral direction, parallel to the plane of the wafer surface and perpendicular to the plane of the step riser, from the first point, and a third point, located in the plane of the step riser in the same lateral direction from said second point, is essentially equal to said target width;

(g) curing said flowable layer;

(h) after said curing, adjusting the level of said flowable layer, if necessary, to the bring the surface of said flowable layer to the level of said first point by a selective etchback process;

(i) removing a portion of said silicon nitride layer not covered by said flowable layer, thereby exposing a first region of said polysilicon layer;

removing said flowable layer;

(k) forming an second silicon oxide layer on said first region by thermal oxidation of said polysilicon layer;

(l) removing residual said silicon nitride layer;

(m) performing a first anisotropic etching of said first region, using said second silicon oxide layer as a mask, thereby leaving a residual polysilicon thickness;

(n) removing said second silicon oxide layer;

(o) performing a second anisotropic etching of said polysilicon layer, thereby exposing said gate oxide and said first silicon oxide layer, whereby a polysilicon sidewall with near rectangular cross section and said target width remains alongside said step;

(p) removing said exposed said gate oxide and residual said first silicon oxide layer thereby forming a polysilicon gate;

(q) implanting a first dose of impurity atoms of a second conductivity type into said wafer thereby forming lightly doped drain regions;

(r) depositing an insulative layer over said wafer;

(s) forming insulative sidewalls on said polysilicon gate; and (t) implanting a second dose of impurity atoms of a second conductivity type into said wafer thereby forming source/drain regions and completing the formation of a MOSFET.

33. The method of claim 32 wherein said first silicon oxide layer is between about 200 and 300 nm. thick.

34. The method of claim 32 wherein said etch stop is a silicon oxide and is between about 5 and 30 nm. thick.

35. The method of claim 33 wherein said polysilicon layer is between about 100 and 200 nm. thick.

36. The method of claim 32 wherein said target width is between about 10 and 30 nm.

37. The method of claim 32 wherein said silicon nitride layer is between about 10 and 50 nm. thick.

38. The method of claim 32 wherein said flowable layer is selected from the group consisting of a spin-on-glass, a photoresist, and a polyimide.

39. The method of claim 32 wherein said removing residual said silicon nitride layer, said first anisotropic etching, said removing said second silicon oxide layer, and said second anisotropic etching, are successively performed in a plasma etching tool without breaking vacuum.

40. The method of claim 32 wherein said exposed said gate oxide and residual said first silicon oxide layer are removed with dilute aqueous HF.

\* \* \* \* \*